United States Patent
Lamesch

(10) Patent No.: US 9,529,029 B2
(45) Date of Patent: Dec. 27, 2016

(54) ROBUST CAPACITIVE MEASUREMENT SYSTEM

(75) Inventor: Laurent Lamesch, Reichlange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 641 days.

(21) Appl. No.: 13/701,202

(22) PCT Filed: Jun. 8, 2011

(86) PCT No.: PCT/EP2011/059540
§ 371 (c)(1),
(2), (4) Date: Mar. 14, 2013

(87) PCT Pub. No.: WO2011/154468
PCT Pub. Date: Dec. 15, 2011

(65) Prior Publication Data
US 2013/0176039 A1    Jul. 11, 2013

(30) Foreign Application Priority Data
Jun. 8, 2010    (LU) .......................................... 91696

(51) Int. Cl.
*G01R 27/26*    (2006.01)
*H03K 17/955*    (2006.01)

(52) U.S. Cl.
CPC ......... *G01R 27/2605* (2013.01); *H03K 17/955* (2013.01); *H03K 2217/960705* (2013.01); *H03K 2217/960775* (2013.01)

(58) Field of Classification Search
CPC ............ G01R 27/2605; G01R 31/2884; G01R 31/3004; G01R 31/31715; G01R 31/31701; H03K 17/955; H03K 2217/960705; H03K 2217/960775; H03K 2217/96077; H01L 22/34
(Continued)

(56) References Cited

U.S. PATENT DOCUMENTS 4,879,508 A * 11/1989 Andermo ....................... 324/690
5,461,320 A * 10/1995 Strack et al. ................. 324/662
(Continued)

FOREIGN PATENT DOCUMENTS

WO    2008039924 A2    9/2007
WO    2008131213 A1    10/2008

OTHER PUBLICATIONS

International Search Report; International Application No. PCT/EP2011/059540; International Application Filing Date Jun. 8, 2011; Mail; Date Sep. 28, 2011.
(Continued)

*Primary Examiner* — Melissa Koval
*Assistant Examiner* — Felicia Farrow
(74) *Attorney, Agent, or Firm* — Reising Ethington P.C.

(57) ABSTRACT

A capacitive sensing circuit is disclosed, wherein the transimpedance amplifier in front of the mixer in prior art is removed respectively replaced by an amplifier with low gain and consequently high dynamic range. The mixer DC offset voltage or current together with the large amplification factor required after the mixer now would result in an unacceptable DC offset at the output of the signal chain. In order to eliminate the effect of the mixer offset, the amplifying stages after the mixer are AC coupled to the mixer output and one of the signals entering the mixer is phase modulated or amplitude modulated with a known low frequency signal. An additional mixer after the AC coupled amplifying stages is driven with the same low frequency modulating signal, resulting in the wanted DC output signal responsive to the capacitance to be measured.

10 Claims, 3 Drawing Sheets

(58) Field of Classification Search
USPC ........... 324/750.3, 750.17, 754.01, 660–661, 324/656, 658, 665, 606, 667, 676, 672, 324/674, 632, 687, 681
See application file for complete search history.

(56) References Cited

U.S. PATENT DOCUMENTS

| | | | | |
|---|---|---|---|---|
| 6,025,726 | A | * | 2/2000 | Gershenfeld et al. ........ 324/671 |
| 6,225,710 | B1 | | 5/2001 | Palata |
| 7,868,874 | B2 | | 1/2011 | Reynolds |
| 2005/0253596 | A1 | * | 11/2005 | Kitano ................... G01C 19/56 324/658 |
| 2007/0146019 | A1 | | 6/2007 | Foote |
| 2008/0018611 | A1 | | 1/2008 | Serban et al. |
| 2008/0309353 | A1 | | 12/2008 | Cheung |
| 2009/0153152 | A1 | * | 6/2009 | Maharyta et al. ............ 324/684 |
| 2010/0110037 | A1 | | 5/2010 | Huang et al. |

OTHER PUBLICATIONS

Datasheet "MC1496, MC1496B BalancedModulators/Demodulator, ON Semiconductors".
Joshua Smith, "Electric Field Sensing for Graphical Interfaces" IEEE Computer Graphics and Applications, published in Computer Graphics I/O Devices, Issue May/Jun. 1998, pp. 54-60.
Paul Horowitz and Winfield Hill, "The Art of Electronics, 2nd edition", p. 185, Fig.4.18.
Arthur B. Williams and Fred J. Taylor, "Electronic Filter Design Handbook", Chapters. 2, 3 and 11.
C. Toumazou, "Current Conveyor Theory and Practice, A.S. Sedra and G.W. Roberts Published in •Advances in Analog Integrated Circuit Design" Peter Peregrinus Limited, London, England, pp. 93-126, 1990.
Written Opinion, International Application No. PCT/EP2011/059540; International Application Filing Date Jun. 8, 2011; Mail; Date Sep. 28, 2011.

* cited by examiner

ROBUST CAPACITIVE MEASUREMENT SYSTEM

FIELD OF THE INVENTION

The present invention generally relates to the technical field of capacitive measurement circuits and more specifically to a capacitive measurement system having one or more electrodes, in which the characteristics of a conductive body such as shape and location are determined by means of capacitive coupling via the electrically conductive body.

BACKGROUND OF THE INVENTION

Capacitive measurement and/or detection systems have a wide range of applications, and are among others widely used for the detection of the presence and/or the position of conductive body in the vicinity of an electrode of the system. A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which could comprise the one or more antenna electrodes themselves—at which the influence of an object or living being on the electric field is detected.

The technical paper entitled "Electric Field Sensing for Graphical Interfaces" by J. R. Smith, published in Computer Graphics I/O Devices, Issue May/June 1998, pp 54-60 describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling.

The capacitive coupling is generally determined by applying an alternative voltage signal to a capacitive antenna electrode and by measuring the current flowing from said antenna electrode either towards ground (in the loading mode) or into the second electrode (receiving electrode) in case of the coupling mode. This current is usually measured by means of a transimpedance amplifier, which is connected to the sensing electrode and which converts a current flowing into said sensing electrode into a voltage, which is proportional to the current flowing into the electrode.

FIG. 1 shows a typical prior art circuit configured to measure an unknown capacitance in so-called 'loading' mode meaning that the capacitance between an electrode of a capacitive sensor and ground or earth is measured.

An AC voltage source 1 generates an AC voltage signal of known frequency and amplitude, for example a periodic sine wave of 100 kHz and 1 V peak amplitude. The output node 2 of AC voltage source 1 is connected to the non-inverting input of an operational amplifier 3. Operational amplifier 3 is configured as transimpedance amplifier. Operational amplifier 3, through the feedback action of associated feedback impedance 4 (preferably a capacitance connected in parallel to a resistance, whereby the impedance of the capacitance at the operating frequency is at least 10 times smaller than the resistance), maintains substantially the same potential on its inverting input as on its non-inverting input, thereby keeping sense node 5 at the same potential than AC voltage source output 2. The unknown capacitance 6 to be measured accordingly has the AC voltage source voltage applied across its "plates".

The current flowing through unknown capacitance 6 is then given by its capacitance and the known AC voltage source voltage, said current flowing also through feedback impedance 4 as the input current into the non-inverting input of amplifier 3 is substantially zero.

The voltage on output 7 of amplifier 3 is accordingly responsive to the AC voltage source voltage and the unknown capacitance. This amplifier output voltage is then mixed with mixer 8 (for example a switching mixer or a multiplier) whereby the local oscillator input of mixer 8 is driven by the AC voltage source output 2. The output of mixer 8 is a DC voltage superimposed with multiples of the AC voltage source frequency, the DC voltage level being responsive to the amplitude of the amplifier output 7 and thereby of AC voltage source output voltage 2 and unknown capacitance 6.

As only the DC voltage is desired, the multiples of the AC voltage source frequency are filtered out with low pass filter 10. The output signal 11 of the low pass filter is a DC voltage responsive to the AC voltage source voltage and the unknown capacitance. Furthermore, an adjustable phase shift (preferably of selectable steps of 0 and 90 degrees) can be introduced between the AC voltage source output 2 and local oscillator input of mixer 8, thereby allowing the measurement of the complex impedance 6 instead of a capacitance 6.

FIG. 2 shows a typical prior art circuit configured to measure an unknown capacitance in so-called 'coupling' mode meaning that the capacitance between two electrodes of a capacitive sensor is measured.

In this variant, an AC voltage source 1 generates an AC voltage signal of known frequency and amplitude, for example a periodic sine wave of 100 kHz and 1 V peak amplitude. The output node 2 of AC voltage source 1 is connected to the first plate of unknown capacitance 6. The second plate of unknown capacitance 6 is connected to the inverting input of an operational amplifier 3. The non-inverting input of amplifier 3 is connected to ground. Operational amplifier 3, through the feedback action of the associated feedback impedance 4 (preferably a capacitance connected in parallel to a resistance, whereby the impedance of the capacitance at the operating frequency is at least 10 times smaller than the resistance), maintains substantially the same potential on its inverting input as on its non-inverting input, thereby keeping sense node 5 at ground potential. The unknown capacitance 6 to be measured accordingly has the AC voltage source voltage applied across its "plates".

The current flowing through unknown capacitance 6 is then given by its capacitance and the known AC voltage source voltage, said current flowing also through feedback impedance 4 as the input current into the non-inverting input of amplifier 3 is substantially zero.

The voltage on output 7 of amplifier 3 is accordingly responsive to the AC voltage source voltage and the unknown capacitance. This amplifier output voltage is then mixed with mixer 8 (for example a switching mixer or a multiplier) whereby the local oscillator input of mixer 8 is driven by the AC voltage source output 2. The output of mixer 8 is a DC voltage superimposed with multiples of the AC voltage source frequency, the DC voltage level being responsive to the amplitude of the amplifier output 7 and thereby of AC voltage source output voltage 2 and unknown capacitance 6.

As only the DC voltage is desired, the multiples of the AC voltage source frequency are filtered out with low pass filter 10. The output signal 11 of the low pass filter is the DC voltage responsive to the AC voltage source voltage and the unknown capacitance. Furthermore, an adjustable phase shift (preferably of selectable steps of 0 and 90 degrees) can be introduced between the AC voltage source output 2 and local oscillator input of mixer 8, thereby allowing the measurement of the complex impedance 6 instead of a capacitance 6.

For both prior art circuits, the gain of the transimpedance amplifier formed by the operational amplifier 3 and the feedback impedance 4 is configured to be as large as possible in order to achieve low noise performance, and the DC gain of the signal chain stages following the mixer can subsequently be made comparatively low, to avoid DC offset problems. For example, in a practical implementation, for an operating frequency of 100 kHz and a source amplitude of 1 V, the feedback impedance would be chosen to be a capacitor of 100 pF in parallel with a resistance of 1 MΩ.

However, the output signal range of the operational amplifier 3 is limited, for example to an amplitude of 2 V peak for a 5 V power supply. This implies that a parasitic AC current injected into the sense electrode of the capacitive sensor of more than 126 μA peak amplitude will drive the operational amplifier into saturation and introduce an error into the measurement of the unknown capacitance. Such parasitic AC currents are e.g. generated by external noise sources, one example being the so-called 'Bulk current injection' (BCI) test during the qualification of an occupant detection system.

OBJECT OF THE INVENTION

The object of the present invention is to provide a robust capacitive measurement circuit, which is less sensitive to such parasitic AC currents.

GENERAL DESCRIPTION OF THE INVENTION

In order to overcome the abovementioned problems, the present invention proposes a capacitive sensing circuit, wherein the transimpedance amplifier upstream of the mixer in the prior art circuits is removed respectively replaced by an amplifier with low gain and consequently high dynamic range. The mixer DC offset voltage or current together with the large amplification factor required after the mixer now would result in an inacceptable DC offset at the output of the signal chain. In order to eliminate the effect of the mixer offset, the amplifying stages after the mixer are AC coupled to the mixer output and one of the signals entering the mixer is phase modulated or amplitude modulated with a known low frequency signal. An additional mixer after the AC coupled amplifying stages is driven with the same low frequency modulating signal, resulting in the wanted DC output signal responsive to the capacitance to be measured.

In a first preferred embodiment the capacitive detection system comprises a first AC signal generator configured to generate a first AC voltage signal, a second AC signal generator configured to generate a second AC voltage signal, said second AC voltage having a lower frequency than said first AC signal, and a first mixer for mixing said first AC voltage signal and said second AC volt-age signal and for generating a modulated AC voltage signal.

The capacitive detection system further comprises a control and evaluation unit operatively coupled to an antenna electrode or a separate receiving electrode, said control and evaluation unit comprising a current measurement circuit configured to measure current signals, said current signals comprising amplitude and/or phase of a current flowing in said antenna electrode or in said separate receiving electrode, said control and evaluation unit being configured to determine a capacitance to be measured based upon said measured current signals, and to output an out-put signal indicative of said determined capacitance. According to one aspect of the invention said current measurement circuit comprises a capacitance to current or voltage converter coupled across said capacitance to be determined, said current or voltage converter comprising an input and an output, and a second mixer operatively coupled to the output of said capacitance to cur-rent or voltage converter. One of said first AC signal generator or said first mixer is operatively coupled to said capacitance to current or voltage converter for supplying said first AC voltage signal or said modulated AC voltage signal to said input of said capacitance to current or voltage converter. The other one of said first AC signal generator or said first mixer is operatively coupled to a second input, preferably a local oscillator input, of said second mixer.

In one variant of the above system, said first AC signal generator is operatively coupled to said second mixer to apply said first AC voltage signal to said second input, preferably a local oscillator in-put, of said second mixer and said capacitance to current or volt-age converter is operatively coupled to said first mixer to apply said modulated AC voltage signal to said input of said capacitance to current or volt-age converter. In an alternative variant said first mixer is operatively coupled to said second mixer to apply said modulated AC voltage signal to said second input, preferably a local oscillator input, of said second mixer and said capacitance to current or voltage converter is operatively coupled to said first AC signal generator to apply said first AC voltage signal to said input of said capacitance to current or voltage converter.

In one embodiment of the capacitive detection system, said other one of said first AC signal generator or said first mixer is operatively coupled to a phase shifted version of said first AC voltage signal or said modulated AC voltage signal.

Finally an output signal at the output of said second mixer is preferably amplified and filtered by means of a bandpass filter and subsequently mixed with the second AC voltage signal of said second AC signal generator.

BRIEF DESCRIPTION OF THE DRAWINGS

Further details and advantages of the present invention will be apparent from the following detailed description of not limiting embodiments with reference to the attached drawings, wherein.

DESCRIPTION OF PREFERRED EMBODIMENTS

Figure 3:
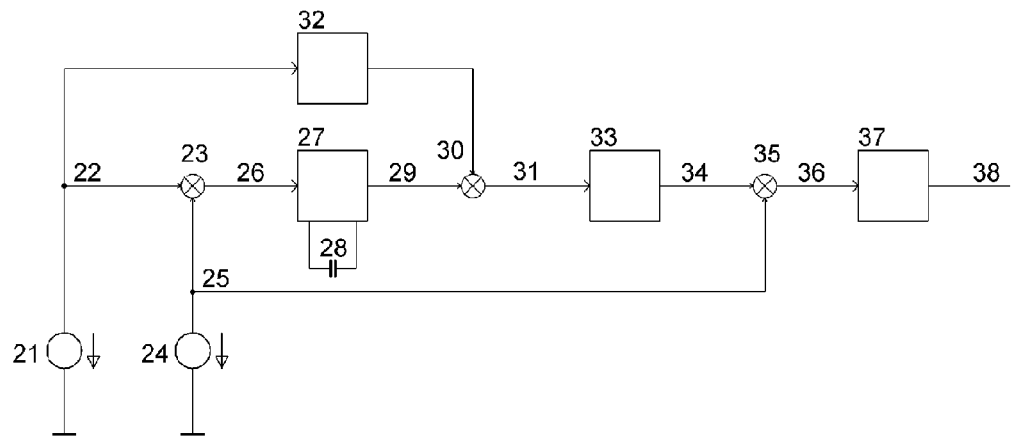
FIG. 3 a first embodiment of a sensing circuit according to the present invention.

The circuit shown in FIG. 3 is a first embodiment allowing to substantially improve the immunity of the capacitance measurement circuit against injection of external parasitic AC currents. AC voltage source 21 generates an AC voltage signal of known frequency and amplitude, for example a periodic sine wave of 100 kHz and 1 V peak amplitude. Its output node 22 is connected to a first input of mixer 23.

A second AC voltage source 24 generates a second AC voltage signal of know frequency and amplitude, but of lower frequency than the output frequency of AC voltage source 21, for example a periodic square wave of 1 kHz and 1V peak amplitude. The output 25 of AC voltage source 24 is connected to the second input, the local oscillator input, of mixer 23. Mixer 23 multiplies the signals at its two inputs.

For the specific example signals described above, a phase modulated sine wave will be generated at its output 26, that is for the first half of the period of the output signal of AC voltage source 24, the output 26 will be identical to the output signal of AC voltage source 21, and during the second half of the period of AC voltage source 24, the output 26 will be the inverted version of the output signal of AC voltage source 21.

Obviously, different waveforms can be used instead of the square waveform for AC voltage source 24, for example a so-called pseudo random noise binary sequence, or a swept frequency or stepped frequency square wave. 27 is a capacitance to current or voltage converter, which accepts an AC voltage 26 on its input, copies the same AC voltage across the unknown capacitance respectively impedance 28, measures the AC current through the unknown capacitance respectively impedance 28 and outputs a current or voltage responsive to said current to its output 29.

The capacitance to current or voltage converter 27 together with unknown capacitance respectively impedance 28 can be configured either as loading or coupling measurement mode. Implementation details will be described in the examples below. The capacitance to current or voltage converter 27 is for example a so-called current conveyor type II, described in 'Current Conveyor Theory and Practice', A. S. Sedra and G. W. Roberts, Published in 'Advances in Analog Integrated Circuit Design' by C. Toumazou, F. J. Lidgey and D. G. Haigh (Editors), Peter Peregrinus Limited, London, England, pp. 93-126, 1990, or a transistor operated in common base configuration, or a transimpedance amplifier with low gain.

The output signal 29 of capacitance to current or voltage converter 27 is fed into the first input of mixer 30. A switching mixer which multiplies the signal on its input by +1 or −1 can be used, or a multiplying mixer for an even better rejection of injected parasitic AC currents. The second input, the local oscillator input, of mixer 30 is fed by a phase-shifted version of the output signal of AC voltage source 21.

The phase shift is generated by the adjustable phase shifter 32. Typically, the phase shift of phase shifter 32 is first set to 0 degrees, then a first measurement is performed, then the phase shift is set to 90 degrees, then a second measurement is performed. By doing two measurements, the complex impedance of the unknown capacitor respectively impedance 28 can be calculated.

At the output 31 of mixer 30, a first AC signal with the same frequency as the frequency of the AC voltage source 24 will appear, superimposed with a second image AC signal of the signal of AC voltage source 24, shifted to twice the frequency of the output signal of AC voltage source 21. Depending on the mixer, further images will be produced at the harmonics of the output signal of AC voltage 21.

As only the first, low frequency AC signal is of interest for the capacitive measurement, the higher frequency components will be eliminated by the amplifier 33, configured as bandpass filter, amplifying the first, low frequency AC signal and at the same time eliminating any DC offset signal at the output of mixer 31, and at the same time, substantially suppressing any signal which has higher frequency components than the wanted, first low frequency signal. Amplifier 33 can for example be configured for the assumed 1 kHz output frequency of AC voltage source 24, with an AC coupled (capacitive coupled) 4-pole Butterworth lowpass filter with a cutoff frequency of 1.5 kHz, implemented for example with two operational amplifiers in the Sallen-Key configuration.

The resulting 1 kHz signal 34 at the output of bandpass amplifier 33 is then again mixed with the AC output signal of AC signal source 24 by mixer 35, and amplified and low-pass filtered by amplifier 37 configured as low pass filter. Amplifier 37 can for example be realized with a DC-coupled 2-pole Butterworth lowpass filter with a 100 Hz cutoff frequency, implemented for example with one operational amplifiers in the Sallen-Key configuration.

Another preferable, less complex option is to replace amplifier 37 with a passive low pass RC filter, having a DC gain of one when the amplifier 33 has been chosen to have sufficient gain for the application.

The DC voltage at the final output 38, will then, due to the action of mixer 35 and low-pass action of amplifier 37, be responsive to the amplitude of the 1 kHz signal 34 at the input of mixer 35. Finally, said DC voltage is responsive to the current through the unknown capacitance respectively impedance 28.

By performing the two consecutive measurements described above (the first one with phase shifter 32 adjusted to 0 degrees phase, the second one with phase shifter 32 adjusted to 90 degrees phase shift), and by combining the two consecutive DC levels obtained at the output 38, the impedance of the unknown capacitance respectively impedance 28 can be calculated.

The sequencing of the measurements and the measurement of the DC level at output 38 and the computation of the impedance of the unknown capacitance respectively impedance 28, is preferably performed by a microcontroller equipped with an integrated ADC (analog to digital converter). Alternatively, mixer 35 and low-pass filtering amplifier 37 can all be implemented inside a microcontroller equipped with an ADC, by connecting the ADC input directly to the output 34 of amplifier 33, and realizing the mixer in software by multiplying the ADC results alternatively with the values +1 and −1, synchronized to the AC voltage source 24, and then low-pass filtering or integrating the resulting values by software.

Figure 5:
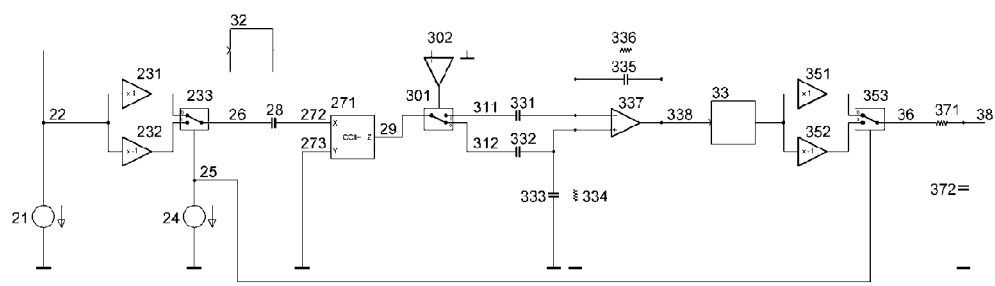
FIG. 5 shows a preferred embodiment of the circuit in FIG. 3.

The reason why the circuit in FIG. 3 is more immune to the injection of a parasitic AC current will be detailed in the description of the circuit in FIG. 5. In order to optimally suppress injected parasitic AC currents, it is preferable to first perform a sweep or stepped scan of the frequency of the AC voltage source 21, detect the frequency or frequencies where the parasitic AC currents are located, and then set the measurement frequency of AC voltage source 21 to a frequency where there no parasitic AC current has been detected, and where also no subharmonic of a parasitic AC current is present.

Figure 4:
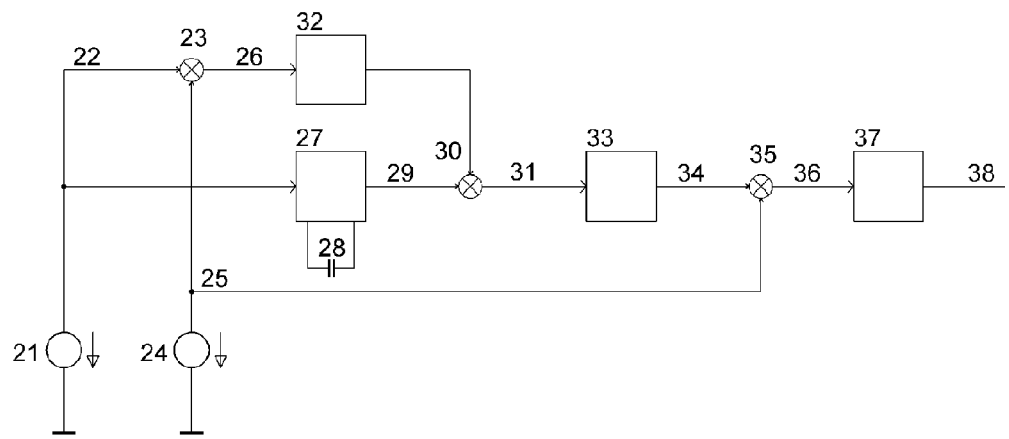
FIG. 4 an alternative embodiment of a 'sensing circuit according to the present invention.

An alternative to the circuit shown in FIG. 3 is the circuit shown in FIG. 4. The difference to the circuit in FIG. 3 is that the input of the capacitance to current or voltage converter 27 is directly connected to the output of the AC voltage source 21 and the input of phase shifter is connected to the output 26 of mixer. The rest of the operation of the circuit is identical to the circuit in FIG. 3, except that the capacitance to current or voltage converter 27 and unknown capacitance respectively impedance 28 is now fed with a continuous wave, non modulated, periodic signal instead of a modulated one as in FIG. 3.

FIG. 5 shows one preferred embodiment of circuit in FIG. 3 working in coupling mode. Mixer 23 in FIG. 3 is composed of a non-inverting amplifier 231 and an inverting amplifier 232. AC voltage source 21 generates an AC voltage signal of known frequency and amplitude, for example a periodic sine wave of 100 kHz and 1 V peak amplitude.

Low frequency AC voltage source switches one of the two outputs of said amplifiers to node 26 by using the multiplexer 233. Amplifiers 231 and 232 can be preferably implemented with suitably configured operational amplifiers, multiplexer 233 can for example be a commonly available 74HC4053 CMOS multiplexer. The output of AC voltage source 24 is in that case preferably a square wave with a low level of 0 V and a high level of 5 V. The operating frequency is set to 1 kHz.

The current flowing through unknown capacitance of impedance 28 is flowing into the type II current conveyor 271. An example for a current conveyor is the OPA860 Operational Transconductance Amplifier from Texas Instruments Incorporated. The current conveyor replaces the capacitance to current or voltage converter 27 in FIG. 3. Said current conveyor keeps its X input (node 272) at the same AC potential than its Y input (node 273) which is at ground potential. Therefore the voltage across the unknown capacitance respectively impedance is equal to the voltage at node 26. Said current conveyor copies the current flowing into its X input onto its Z output connected to node 29. The same current is flowing into the multiplexer 301. Multiplexer 301 and comparator 302 replaces the mixer 30 in FIG. 3. Multiplexer 301 can for example be a commonly available 74HC4053 CMOS multiplexer.

Comparator 302 transforms the phase shifted sine wave coming out of phase shifter 32 into a square wave of for example a low level of 0 V and a high level of 5 V, in order to drive the control input of multiplexer 301 adequately. Comparator 302 can for example be a commonly available LM393 comparator. Components 331, 332, 333, 334, 335, 336, 337 constitute an AC coupled differential integrator with finite DC gain.

Capacitors 331 and 332 form the AC coupling for the integrator. The current flowing out of the current conveyor output Z and which is routed through multiplexer 301 and capacitor 331 into the inverting input of the differential integrator, is integrated and decreases the output voltage of said differential integrator. The current flowing out of the current conveyor output Z and which is routed through multiplexer 301 and capacitor 332 into the non-inverting input of the differential integrator, is integrated and increases the output voltage of said differential integrator. Resistors 334 and 336 prevent the integrator from saturation. Preferred values for the capacitors 331 and 332 are for example 500 nF, for capacitors 333 and 335 10 nF and for resistors 334 and 336 500 kn.

A further amplifier, 33 with for example a voltage gain of 10 and a 4-pole Butterworth lowpass characteristic with a cutoff frequency of 1.5 kHz is added after the output of said differential integrator. The details of such an amplifier are not further described here as they can be easily taken out of a standard filter design book, for example from 'Electronic Filter Design Handbook', Arthur B. Williams, Fred J. Taylor.

Mixer 25 in FIG. 3 is composed of a non-inverting amplifier 351 and an inverting amplifier 352. Low frequency AC voltage 24 source switches one of the two outputs of said amplifiers to node 36 by using the multiplexer 353. Amplifiers 351 and 352 can be preferably implemented with suitably configured operational amplifiers, multiplexer 353 can for example be a commonly available 74HC4053 CMOS multiplexer. A further lowpass filter is added to the mixer output with resistor 371 and capacitor 372.

The final DC level output, responsive to the current flowing through the unknown capacitance respectively impedance 28 is present on the output 38. A parasitic AC current injected into the sense electrode of the capacitive sensor (X input 272 in FIG. 5) will be substantially suppressed by the mixing action of mixer 301 and lowpass filtering action of said differential integrator.

Figure 1:
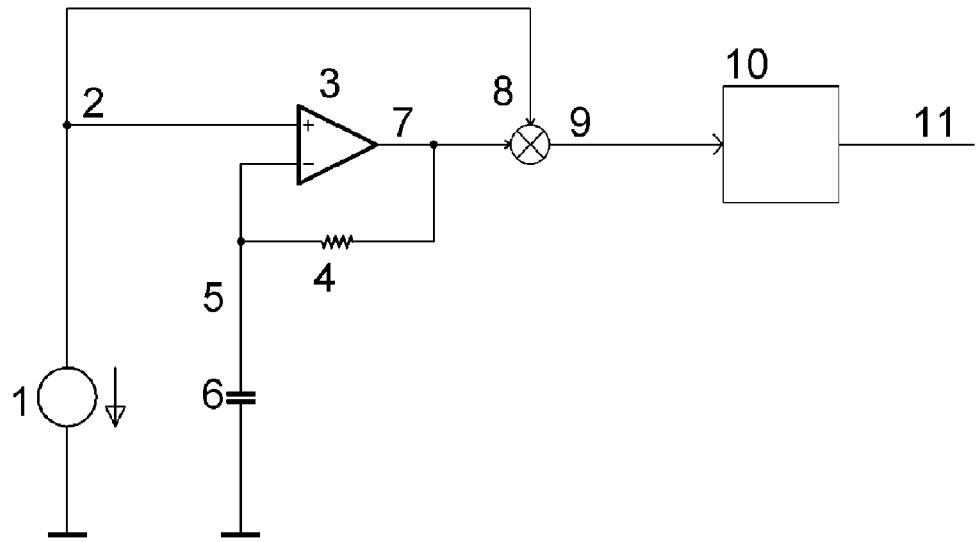
FIG. 1 shows a prior art 'loading' mode sensing circuit.
Figure 2:
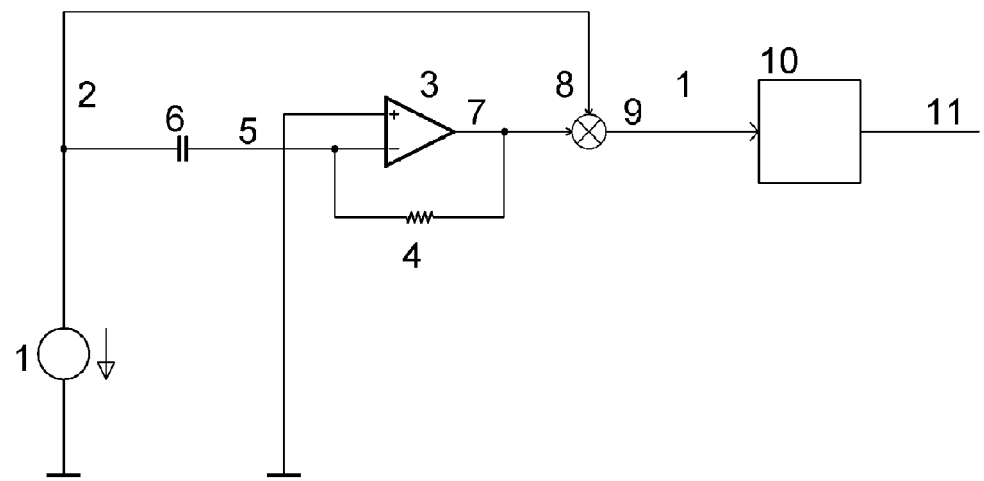
FIG. 2 shows a prior art 'coupling' mode sensing circuit.

The maximal peak amplitude of the parasitic AC current which can be injected before the capacitance measured is substantially falsified will be largely defined by the current compliance range of the current conveyor 271, which is 9 mA for the OPA860 mentioned above, and which compares favourably to the 126 µA peak amplitude for the prior art circuit in FIG. 1.

Figure 6:
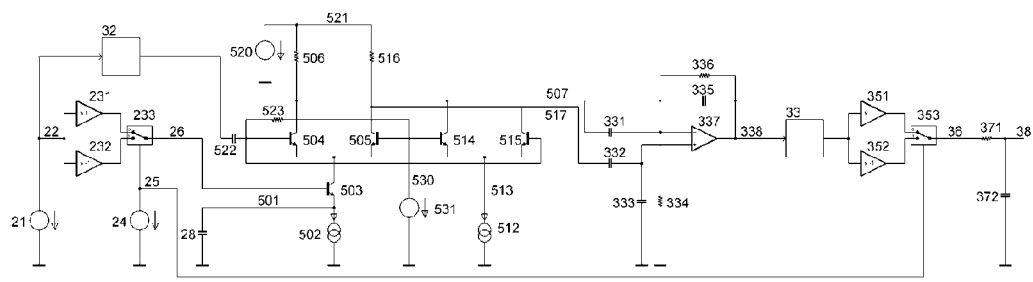
FIG. 6 an alternative embodiment of the circuit in FIG. 3.

FIG. 6 shows one preferred embodiment of circuit in FIG. 3 working in loading mode. The circuit in FIG. 6 is almost identical to the circuit in FIG. 5, except that the capacitance to current or voltage converter 27 in FIG. 3 and the mixer 30 in FIG. 3 are implemented differently in FIG. 6. Therefore, only the implementation in FIG. 6 of said two parts of FIG. 3 will be described.

Transistors 503, 504, 505, 514, 515 and current sources 502 and 512 essentially form a double balanced mixer, similar to the one implemented in the integrated circuit MC1496 by ON Semiconductors. A detailed description of the double balanced mixer is contained in Datasheet 'MC1496, MC1496B Balanced Modulators/Demodulators', ON Semiconductors.

The output 26 of multiplexer 233 is connected to the base of transistor 503. DC collector current of transistor 503 is biased with current sink 502. The AC voltage on node 26 will also appear almost entirely on the emitter of transistor 503, and thereby across unknown capacitor or impedance 28. The AC current though unknown capacitor or impedance 28 will also appear almost entirely on the collector of transistor 503.

As the voltage across unknown capacitor or impedance 28 is known, said AC current is responsive to the impedance of unknown capacitor or impedance 28. Said AC current is injected into the transistor pair 504, 505. Bias voltage source 531 sets the bias voltage on the bases of transistors 504 and 514, and trough resistor 523 also on the bases of transistors 504 and 515.

The output of phase shifter 32 is AC coupled with capacitor 522 into the base of transistor 504. During the positive interval of the signal at the output of phase shifter 32, transistors 504 and 515 are conducting, while transistors 505 and 514 are not conducting, due to their relative base voltages. During the negative interval of the signal at the output of phase shifter 32, transistors 505 and 514 are conducting, while transistors 504 and 515 are not conducting, due to their relative base voltages. Thereby, analogous to the multiplexer 301 in FIG. 5, the AC current out of collector of transistor 503 is routed either into resistor 506 and capacitor 331 or into resistor 516 and capacitor 332.

The transistor pair on the right, transistors 514 and 515 are employed to suppress the local oscillator components coming from the switching action of transistors 504 and 505 in the output signal. The current sunk by current sink 512 is therefore set substantially equal to the current sunk by current sink 502. DC voltage source 520 is the power supply for said double balanced mixer. It has a DC voltage of for example 15 V. Suitable values for capacitor 522 and resistor 523 are for example 100 nF and 1 kΩ respectively, and 5 mA for each of the current sinks, and 1 kΩ for resistors 506 and 516. The differential output currents of said double balanced mixer are routed to the same AC coupled differential integrator as in FIG. 5. The rest of the operation of the circuit in FIG. 6 is identical to the operation of circuit in FIG. 5.

The invention claimed is:

1. A capacitive detection system, comprising:
   a first AC signal generator configured to generate a first AC voltage signal,
   a second AC signal generator configured to generate a second AC voltage signal, said second AC voltage having a lower frequency than said first AC signal,
   a first mixer for mixing said first AC voltage signal and said second AC voltage signal and for generating a modulated AC voltage signal,
   a control and evaluation unit operatively coupled to an antenna electrode or a separate receiving electrode, said control and evaluation unit comprising a current measurement circuit configured to measure current signals, said current signals comprising amplitude and/or phase of a current flowing in said antenna electrode or in said separate receiving electrode, said control and evaluation unit being configured to determine a capacitance to be measured based upon said measured current signals, and to output an output signal indicative of said determined capacitance;
   wherein said current measurement circuit comprises a capacitance to current or voltage converter coupled across said capacitance to be determined, said capacitance to current or voltage converter comprising an input and an output, and a second mixer operatively coupled to the output of said capacitance to current or voltage converter, and
   wherein said first mixer is operatively coupled to said capacitance to current or voltage converter for supplying said modulated AC voltage signal to said input of said capacitance to current or voltage converter and wherein said first AC signal generator is operatively coupled to a second input of said second mixer.

2. The capacitive detection system according to claim 1, wherein said first AC signal generator is operatively coupled to said second input of said second mixer to apply said first AC voltage signal to said second input of said second mixer.

3. The capacitive detection system according to claim 1, wherein said first AC signal generator is operatively coupled to said second input of said second mixer via a phase shifter to apply a phase shifted version of said first AC voltage signal to said second input of said second mixer.

4. The capacitive detection system according to claim 1, wherein an output signal at the output of said second mixer is amplified and filtered by means of a bandpass filter and subsequently mixed with the second AC voltage signal of said second AC signal generator.

5. The capacitive detection system according to claim 1, wherein said second input of said second mixer is a local oscillator input of said second mixer.

6. A capacitive detection system, comprising:
   a first AC signal generator configured to generate a first AC voltage signal,
   a second AC signal generator configured to generate a second AC voltage signal, said second AC voltage having a lower frequency than said first AC signal,
   a first mixer for mixing said first AC voltage signal and said second AC voltage signal and for generating a modulated AC voltage signal,
   a control and evaluation unit operatively coupled to an antenna electrode or a separate receiving electrode, said control and evaluation unit comprising a current measurement circuit configured to measure current signals, said current signals comprising amplitude and/or phase of a current flowing in said antenna electrode or in said separate receiving electrode, said control and evaluation unit being configured to determine a capacitance to be measured based upon said measured current signals, and to output an output signal indicative of said determined capacitance;
   wherein said current measurement circuit comprises a capacitance to current or voltage converter coupled across said capacitance to be determined, said current or voltage converter comprising an input and an output, and a second mixer operatively coupled to the output of said capacitance to current or voltage converter, and
   wherein said first AC signal generator is operatively coupled to said capacitance to current or voltage converter for supplying said first AC voltage signal to said input of said capacitance to current or voltage converter and wherein said first mixer is operatively coupled to a second input of said second mixer.

7. The capacitive detection system according to claim 5, wherein said first mixer is operatively coupled to said second input of said second mixer to apply said modulated AC voltage signal to said second input of said second mixer.

8. The capacitive detection system according to according to claim 5, wherein said first mixer is operatively coupled to said second input of said second mixer via a phase shifter to apply a phase shifted version of said modulated AC voltage signal to said second input of said second mixer.

9. The capacitive detection system according to according to claim 5, wherein an output signal at the output of said second mixer is amplified and filtered by means of a bandpass filter and subsequently mixed with the second AC voltage signal of said second AC signal generator.

10. The capacitive detection system according to according to claim 5, wherein said second input of said second mixer is a local oscillator input of said second mixer.

* * * * *